United States Patent [19]

Okada et al.

[11] Patent Number: 5,744,854

[45] Date of Patent: Apr. 28, 1998

[54] SURGE PROTECTIVE DEVICE HAVING A SURFACE COLLECTOR REGION DIRECTLY SHORTED TO A BASE REGION

[75] Inventors: Hiroshi Okada, Nukata-gun; Toshitaka Yamada, Okazaki, both of Japan

[73] Assignee: Nippondenso Co., Ltd., Kariya, Japan

[21] Appl. No.: 694,828

[22] Filed: Aug. 9, 1996

[30] Foreign Application Priority Data

Aug. 10, 1995 [JP] Japan .................... 7-204836

[51] Int. Cl.⁶ .................... H01L 23/62
[52] U.S. Cl. .................... 257/565; 257/587; 257/173; 257/546
[58] Field of Search .................... 257/578, 565, 257/163, 164, 165, 587, 173

[56] References Cited

U.S. PATENT DOCUMENTS

| | | | |
|---|---|---|---|
| 4,753,709 | 6/1988 | Welch et al. | 257/587 |
| 5,268,588 | 12/1993 | Marum | 257/579 |
| 5,528,064 | 6/1996 | Thiel et al. | 257/362 |

FOREIGN PATENT DOCUMENTS

| | | |
|---|---|---|
| 55-80350 | 6/1980 | Japan . |
| 2-158142 | 6/1990 | Japan . |
| 5-327365 | 12/1993 | Japan . |

*Primary Examiner*—Tom Thomas
*Assistant Examiner*—David B. Hardy
*Attorney, Agent, or Firm*—Cushman Darby & Cushman IP Group of Pillsbury Madison & Sutro LLP

[57] ABSTRACT

A surge protective device, which has a favorable surge-absorbing characteristic while avoiding increase in chip area and in process complexity, is disclosed. In a surge protective device having an ordinary planar bipolar transistor structure and having a voltage-regulation diode to absorb surge current by breakdown of a junction between an emitter region and base region thereof, a surface collector region thereof is shorted to the base region. Accordingly, when surge current is increased, a pn junction between a collector region and the base region is sufficiently forward biased, and thereby a backward transistor is formed. Surge current is sufficiently absorbed by the operation of the backward transistor.

11 Claims, 4 Drawing Sheets

SURGE PROTECTIVE DEVICE HAVING A SURFACE COLLECTOR REGION DIRECTLY SHORTED TO A BASE REGION

CROSS REFERENCE TO RELATED APPLICATION

This application is based upon and claims the benefit of priority of the prior Japanese Patent Application No. 204836 filed on Aug. 10, 1995, the contents of which are incorporated herein by reference.

BACKGROUND OF THE INVENTION

1. Field of the Invention

The present invention relates to a surge protective device provided with a voltage-regulation diode commonly termed a Zener diode.

2. Related Arts

Japanese Patent Application Laid-open No. 55-80350 proposes providing a surge-absorbing transistor formed by connecting a collector to an input-signal line, connecting an emitter to a low-level power-supply line, and connecting a base to the low-level power-supply line via a resistor. The breakdown voltage between the base and collector of the proposed surge-absorbing transistor is selected to be lower than a breakdown voltage between a base and collector of another signal-processing transistor; and thereby surge voltage superposed on the input-signal line is absorbed, and the signal-processing transistor is prevented from being broken down due to the surge voltage on the input-signal line.

Japanese Patent Application Laid-open No. 2-158142 discloses a voltage-regulation diode utilizing a pn junction between a collector and base of a bipolar transistor wherein an emitter and base thereof are shorted to become an anode and a collector thereof is caused to be a cathode.

However, since both of the above-described conventional devices perform absorption of surge voltage by utilizing breakdown of a collector/base junction of a surge-absorbing transistor, when breakdown voltage of the collector/base junction of the surge-absorbing transistor is not established to be lower than that of the collector/base junction of the transistor in the signal-processing circuit as proposed in the former disclosure, there exists the possibility that surge voltage would not be completely absorbed by the surge-absorbing transistor, and the collector/base junction of the transistor within the signal-processing circuit would breakdown and the signal-processing circuit would malfunction. Meanwhile, causing only the breakdown voltage of the collector/base junction of the surge-absorbing transistor to be reduced leads to complication in processes, and leads to a decline in planned yield. Additionally, the above-described surge-absorbing transistor utilizing a collector/base junction has a collector region of comparatively low concentration. Although a large surge breakdown voltage can be achieved with a single device, collector resistance is correspondingly large, and so there also exists a problem wherein a drop in voltage thereof occurs with respect to large surge current, and voltage-regulating performance, i.e., surge-absorbing performance, is reduced. Further, since the collector region is of comparatively low concentration, accurately establishing surge breakdown voltage is not simple due to fluctuation in concentration thereof.

These problems are improved by connecting in series the required number of voltage-regulation diodes utilizing a pn junction between an emitter/base junction. An example structure of such voltage-regulation diode utilizing an emitter/base junction is indicated in FIG. 8.

This voltage-regulation diode 100 is incorporated within a bipolar-transistor integrated circuit, and is structured so that an emitter region 101 of an ordinary pn isolation type bipolar transistor is taken to be a cathode, a base region 102 thereof is taken to be an anode, an n-type collector region 104 isolated by a p-type isolation region 103 is connected to a high-level power supply Vcc via a surface collector region 105, and the collector region 104 is always reverse-biased with respect to the base region 102. FIG. 9 shows an example of a surge protective circuit wherein a plurality of voltage-regulation diodes utilizing an emitter/base pn junction are connected in series. A surge protective circuit 152 is disposed between an input-signal line Ls and a low-level power-supply line Le which is a ground line, and a surge protective circuit 151 is disposed between a high-level power-supply line Lh and the low-level power-supply line Le. Reference numeral 153 is an integrated circuit for signal processing.

Connecting a plurality of voltage-regulation diodes in series as shown in FIG. 9 achieves a large surge breakdown voltage while solving problems caused by the large collector resistance, but despite this, there exists a problem wherein when surge current increases further (i.e., when a large surge voltage is inputted), resistance of the current path flowing in the base region (hereinafter termed "base resistance") becomes a problem, the voltage-regulation characteristic (surge-absorbing characteristic) is worsened by an amount corresponding to the voltage drop due to this base resistance, and heat generation also increases.

SUMMARY OF THE INVENTION

In light of the foregoing problems, it is an object of the present invention to provide a surge protective device and an integrated circuit with a surge protective circuit employing the surge protective device having a favorable surge-absorbing characteristic while avoiding increase in chip area and in process complexity.

A surge protective device according to the present invention basically comprises: a collector region of a first conductivity type formed on or of a semiconductor substrate; a base region of a second conductivity type and a surface collector region of the first conductivity type formed on a surface portion of the collector region; and an emitter region of a first conductivity type formed on a surface portion of the base region, wherein the emitter region makes up a cathode of a voltage-regulation diode and the base region makes up an anode of the voltage-regulation diode, and wherein the surface collector region is shorted to the base region.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Figure 1:
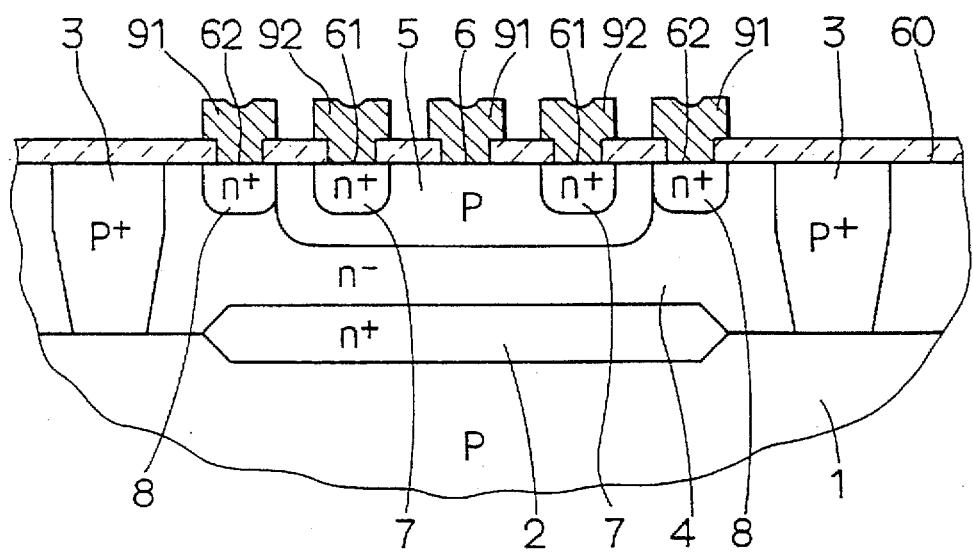
FIG. 1 is a partial sectional view of a chip showing a surge protective device according to a first embodiment of the present invention.

A favorable mode of this invention will be briefly described hereinafter.

A first aspect of this invention is a surge protective device comprising a collector region of a first conductivity type formed on or of a semiconductor substrate; a base region of a second conductivity type and a surface collector region of the first conductivity type formed on a surface portion of the collector region; and an emitter region of a first conductivity type formed on a surface portion of the base region, wherein the emitter region makes up a cathode of a voltage-regulation diode, the base region makes up an anode of the voltage-regulation diode and the surface collector region is shorted to the base region.

According to this structure, a surge protective device and an integrated circuit with a surge protective circuit employing the surge protective device having a favorable surge-absorbing characteristic can be achieved while avoiding an increase in chip area and in process complexity. Mode of operation and effects of the present invention will be described more specifically hereinafter.

According to this structure, in a voltage-regulation diode which performs surge absorption utilizing breakdown of an emitter/base junction of a bipolar transistor (surge-absorbing transistor), the collector region and base region of this bipolar transistor are shorted. That is to say, the collector region is connected to the anode of the voltage-regulation diode. When this is done, surge current flows between the emitter and base in a region where surge voltage is small and a small surge current flows. When a voltage drop in base resistance increases due to this surge current, the base region gradually comes to be forward biased with respect to the collector region. When the surge current increases further, the collector region becomes sufficiently forward biased with respect to the base region and a backward transistor, wherein the collector region is caused to be an emitter and the emitter region is caused to be a collector, is formed. Surge current flows through the collector region to the anode of the voltage-regulation diode, and because this bias path is produced, the voltage-current characteristics of this voltage-regulation diode can have a rising-edge characteristic which is vastly superior to the voltage-regulation diode utilizing an emitter/base junction according to the prior art (see FIG. 3).

Naturally, this voltage-regulation diode can be structured merely by connecting the collector region to the base region, and does not require process extension.

A second aspect of this invention is a surge protective device according to the above-described first aspect, wherein a pair of the emitter regions is formed on the surface portion of the base region, sandwiching a base contact hole. A pair of the surface collector regions is positioned on a side opposite to the base contact hole as viewed from the emitter regions and is formed respectively adjacently to the two emitter regions. According to this invention, emitter regions can be disposed on both sides with respect to a single base contact hole. Moreover surface collector regions can be disposed on an outer side of the base region to be adjacent to the respective emitter regions, and thus the path reaching from the surface collector region to the emitter region is shortened. Resistance loss thereof is reduced and the voltage-regulation characteristic is improved. Along with this, the base contact hole is apart from an effective base region of a lateral bipolar transistor portion between the foregoing surface collector region and emitter region. Therefore, a substantial base resistance of this effective base region increases, and this lateral bipolar transistor portion can operate quickly.

A third aspect of the present invention is an integrated circuit having a surge protective device according to the above-described first aspect, further comprising a high-level power-supply line, a low-level power-supply line, and a signal line for input or output use, all of which are connected to an integrated circuit formed on the semiconductor substrate and isolated from the surge protective device, wherein a pair of the voltage-regulation diodes are individually connected between the high-level power-supply line and the low-level power-supply line on the one hand and the signal line and the low-level power-supply line on the other hand, and a contact electrode (i.e., a pad portion connected to an external line) of the low-level power-supply line is disposed adjacently to the respective anodes of the two voltage-regulation diodes at the lowest potential.

According to this structure, when providing the voltage-regulation diode for signal-line clamping use and the voltage-regulation diode for high-level power-supply line clamping use, the anodes of the two diodes are disposed proximately to the common contact electrode of the low-level power-supply lines. When this is done, length of electrode lines from the contact electrode of the low-level power-supply line to the anodes of the two voltage-regulation diodes can be shortened, and as a result thereof, blowing of these electrode lines due to resistance loss of the electrode lines when large surge current flows can be prevented.

A fourth aspect of the present invention is an integrated circuit having a surge protective device according to the above-described first aspect, further comprising a low-level power-supply line and a high-level power-supply line or a signal line for input or output use, all of which are connected to an integrated circuit formed on the semiconductor substrate and isolated from the surge protective device. A voltage-regulation diode is connected to at least one of a portion between the high-level power-supply line and the low-level power-supply line and a portion between the signal line and the low-level power-supply line. Each of the high-level power-supply line or the signal line and the low-level power-supply line comprises a protective-circuit side wiring portion from a contact electrode portion connected to an external wiring to a cathode or anode of the voltage-regulation diode, and an integrated-circuit side wiring portion from the integrated circuit to the contact electrode portion or the cathode or anode of the voltage-regulation diode, and wherein the protective-circuit side wiring portion is formed wider than the integrated-circuit side wiring portion.

According to the fourth aspect of the present invention, line resistance of the protective-circuit side wiring portion from the contact electrode to the electrode (anode or cathode) of the voltage-regulation diode can be caused to be smaller, and so blowing of the protective-circuit side wiring portion due to a large surge current can be prevented. Additionally, because there is no need to widen the integrated-circuit side wiring portion leading to the integrated circuit for signal-processing use, improvement in a degree of integration due to improvement of the utilization ratio of chip area can be realized. Moreover, junction breakdown of the transistor within the integrated circuit due to the large voltage drop at the integrated-circuit side wiring portion can be suppressed.

A first embodiment of a surge protective device according to the present invention will be described hereinafter with reference to the drawings.

A sectional view of this surge protective device formed by a silicon bipolar process is indicated in FIG. 1.

An n⁺ type buried collector region 2 is formed on a p-type substrate 1, an n⁻ layer formed thereon is isolated by a p⁺ type isolation region 3, forming an n⁻ collector region 4. A p-type base region 5 is formed on a surface portion of the collector region 4, and a base contact hole 6 is formed in a central portion in a lateral direction of the base region 5. In a surface portion of the base region 5, sandwiching this base contact hole 6, are formed n⁺ type emitter regions 7 on the left and right thereof. Further, a pair of n⁺ type surface collector regions 8 are individually and adjacently formed on outer sides of the two emitter regions 7, contacting an outer-side surface of the base region 5.

An emitter contact hole 61 is formed on the emitter region 7, and a collector contact hole 62 is formed on the surface collector region 8. These contact holes 6, 61 and 62 are formed by creating holes in a field oxide film 60. An anode electrode 91 of the voltage-regulation diode is connected to the base region 5 and surface collector region 8 via the contact holes 6 and 62, and a cathode electrode 92 of the voltage-regulation diode is connected to the emitter region 7 via the contact hole 61.

Figure 2:
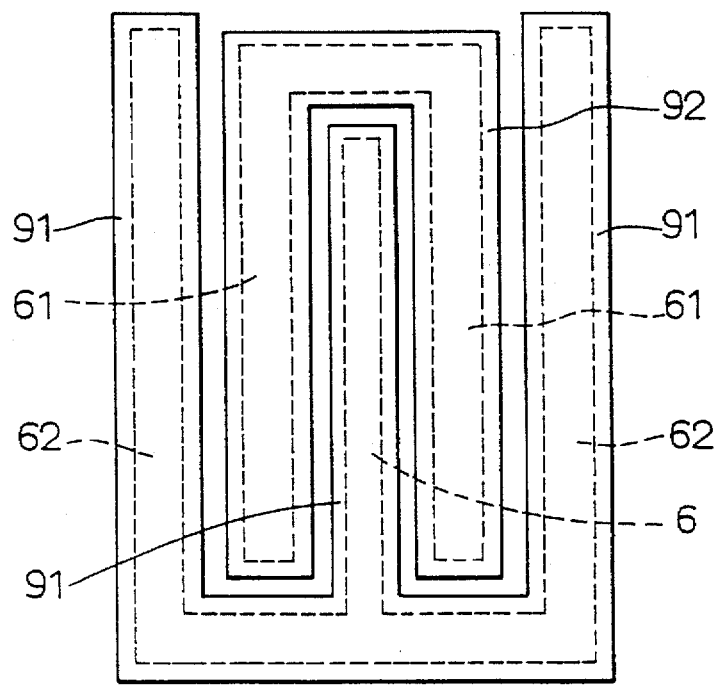
FIG. 2 is a plan view showing an electrode pattern and contact-hole pattern of the surge protective device shown in FIG. 1.

A contact-hole pattern and electrode pattern of the surge protective device of FIG. 1 is indicated in FIG. 2. According to this embodiment, the base region 5 and surface collector region 8 or collector region 4 can be connected to the common anode electrode 91, and so the contact holes 6 and 62 are formed continuously. Of course, it is possible for the contact holes 6 and 62 to be created mutually independently. That is to say, as shown in FIG. 2, the contact holes 6 and 62 and the anode electrode 91 are formed in a substantially E-shaped configuration, the contact hole 61 and the cathode electrode 92 are formed in a substantially U-shaped configuration, and both are interlaced.

Figure 3:
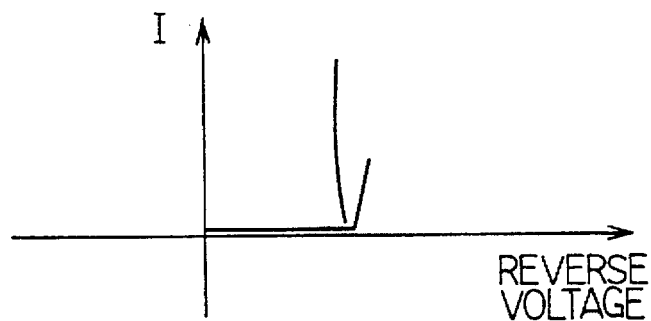
FIG. 3 is a characteristic diagram showing a surge-current absorbing characteristic of the surge protective device shown in FIG. 1.
Figure 4:
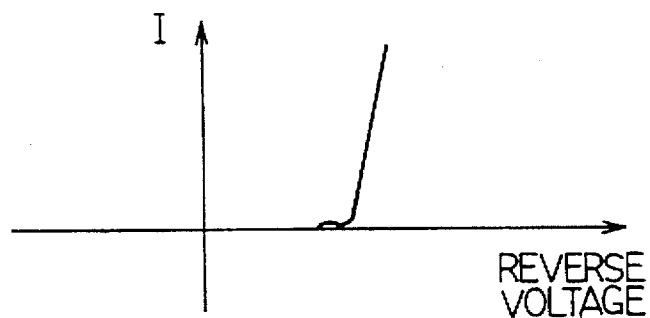
FIG. 4 is a characteristic diagram showing a surge-current absorbing characteristic of a surge protective device according to the prior art indicated in FIG. 8.
Figure 8:
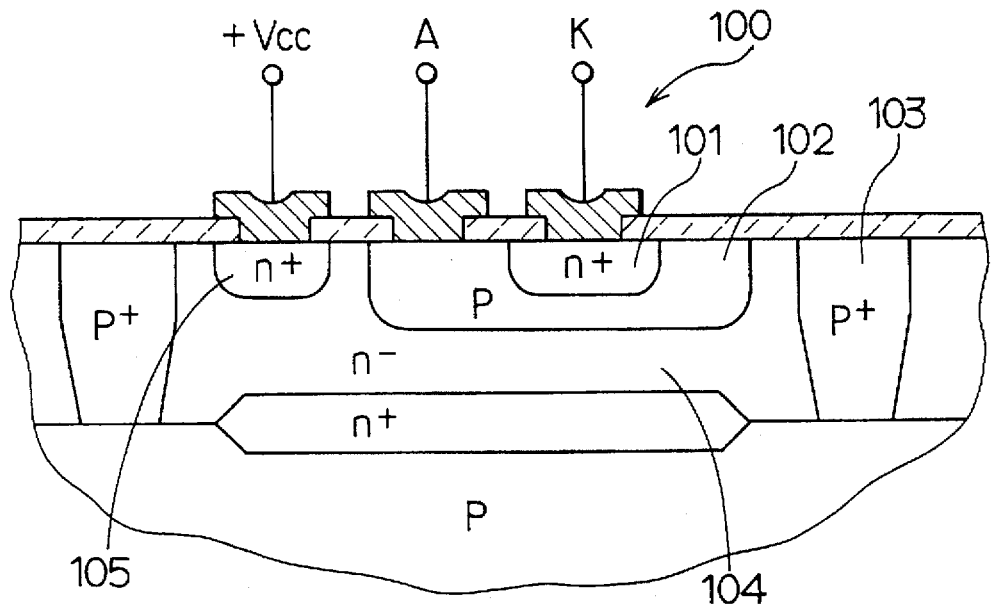
FIG. 8 is a partial sectional view of a chip showing a conventional surge protective device.
Figure 9:
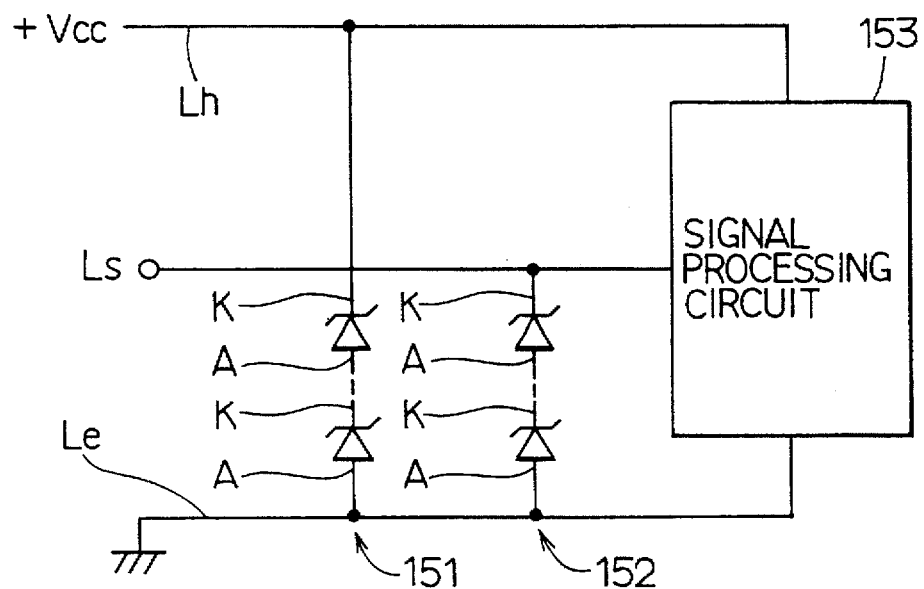
FIG. 9 is an equivalent circuit diagram showing an integrated circuit provided with the surge-absorbing circuit.

FIG. 3 indicates an actually measured surge-absorbing characteristic of this surge protective device, and for comparison therewith, FIG. 4 indicates an actually measured surge-absorbing characteristic of the surge protective device indicated in FIG. 8. The surge protective device according to this embodiment utilizes breakdown of an emitter/base junction of a bipolar transistor (surge-absorbing transistor) as a voltage-regulation diode, and together with this, absorbs large surge current by employing a backward transistor which takes the collector regions 4 and 8 to be an emitter, takes the base region 5 to be a base and takes the emitter region 7 to be a collector. To describe this further, since the surface collector region 8 and base region 5 of this bipolar transistor are shorted by the anode electrode 91, surge current is absorbed solely by breakdown of the junction between merely the emitter region 7 and the base region 5 (solely by the voltage-regulation diode) in a range where surge voltage and surge current are small. Meanwhile, when surge current increases, a voltage drop at the surge-current pass-through path in the base region 5 increases, and as a result thereof, the junction between the base region 5 and the collector region 4 and surface collector region 8 is forward biased, electrons flow into the emitter region 7 (collector of the backward transistor) from the collector region 4 and surface collector region 8 (emitter of the backward transistor), backward-transistor current flows, and thus, surge current is absorbed.

Additionally, there exists an effect which will be described hereinafter because the backward transistor operates to absorb surge.

Generally, impurity concentrations of the respective regions of the transistor have the following relationship:

$$N_E > N_B > N_C,$$

wherein $N_E$ is an impurity concentration of the emitter region, $N_B$ is an impurity concentration of the base region, and $N_C$ is an impurity concentration of the collector region.

Herein, when current amplification factor $h_{fe}$ as an ordinary transistor operation and current amplification factor $h_{fe}'$ as a backward transistor operation are compared, in a case of an ordinary transistor use, emitter concentration $N_E$ is greater than base concentration $N_B$, and so a small proportion of electrons flowing into the base from the emitter are recombined in the base region. Meanwhile, in a case where such ordinary transistor is used as the backward transistor, since base concentration is greater than collector concentration as described above, a high proportion of electrons flowing into the base from the collector (i.e., emitter of the backward transistor) are recombined in the base region. That is to say, -base current becomes large. Due to this, a backward transistor operation makes base current large in comparison with an ordinary transistor use. If base current is taken to be $I_B$, collector current is taken to be $I_C$, and emitter current is taken to be $I_E$, current amplification factor $h_{fe}$ is expressed as:

$$h_{fe} = I_C/I_B = (I_E - I_B)/I_B.$$

Accordingly, current amplification factor $h_{fe}$ becomes smaller for a backward transistor operation with its large base current. Due to this, since the backward transistor operation exhibits a small current amplification factor $h_{fe}$, by structuring the surge protective device so as to cause a backward transistor to be operated, there exists an effect wherein current consumption in the surge protective device is caused to be small in comparison with a surge protective device which causes an ordinary transistor to be operated even if pn-junction leakage occurs.

Moreover, according to this embodiment, as shown in FIG. 2, the emitter regions 7 are formed on the left and right, sandwiching the base contact hole 6, and the surface collector regions 8 are formed respectively adjacently to the emitter regions 7, positioned oppositely to the base contact hole 6, and so the current path reaching from the surface collector region 8 to the emitter region 7 is shortened, resistance loss thereof is reduced, and the voltage-regulation characteristic is improved. Furthermore, since the base contact hole 6 is disposed to be apart from the effective base region of the lateral backward bipolar transistor portion between the surface collector region 8 and the emitter region 7, base resistance of this lateral backward bipolar transistor is increased and this lateral backward bipolar transistor can operate quickly, and additionally, resistance loss can also be reduced by shortening of the distance between the surface collector region 8 and the emitter region 7. Furthermore, because a structure is utilized wherein the outer-side surface of the base region 5 and the surface collector region 8 are contiguous, a further reduction in resistance loss can be realized.

Figure 5:
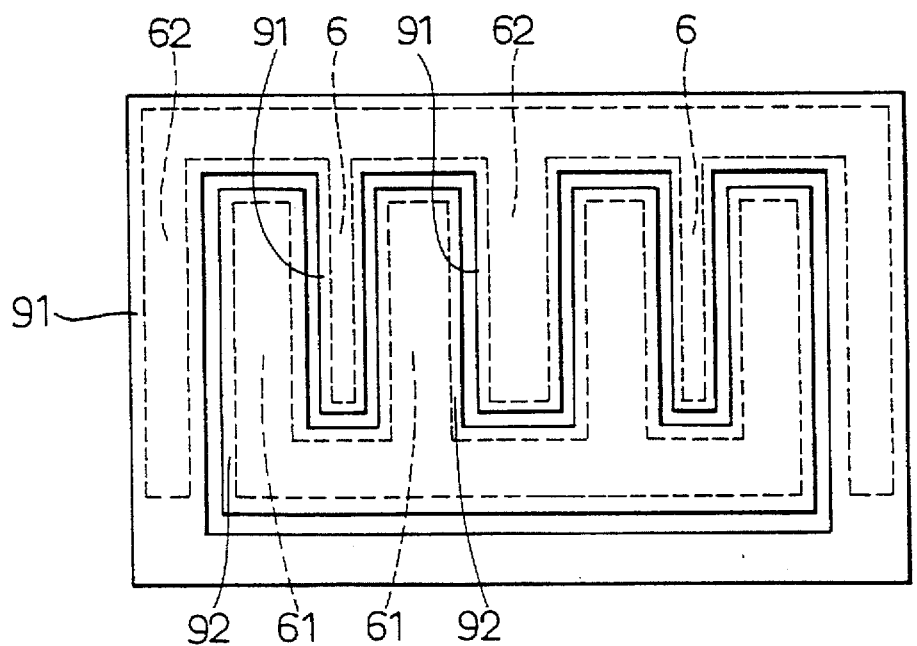
FIG. 5 is a plan view showing a mode of modification of the pattern shown in FIG. 2.

FIG. 5 indicates another pattern example. This pattern example provides two base contact holes 6 with respect to the pattern example shown in FIG. 2, but mode of operation and effects themselves are substantially the same.

Figure 6:
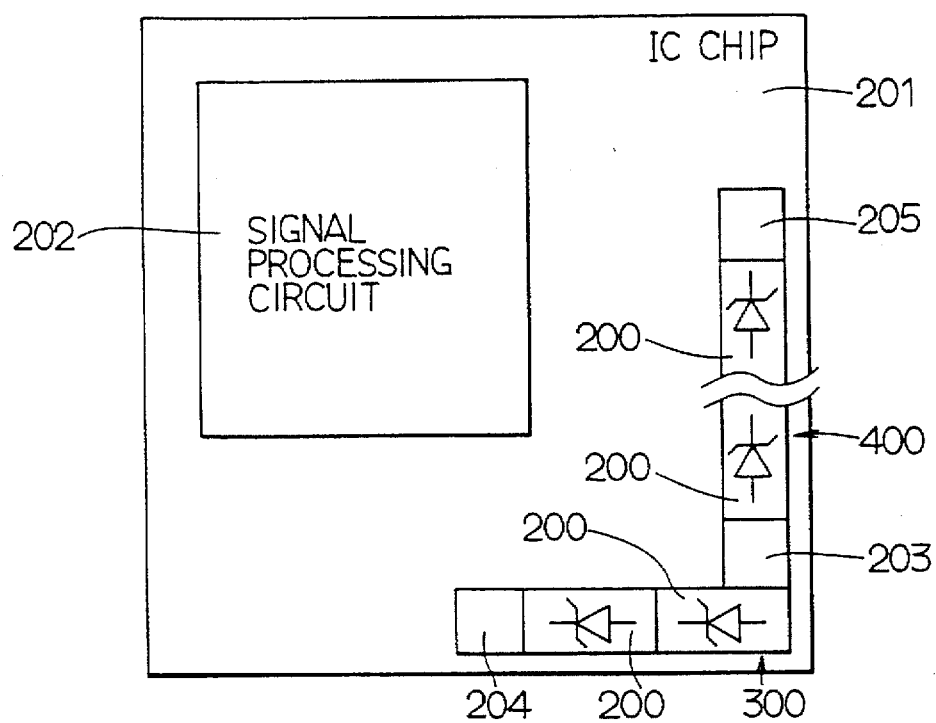
FIG. 6 is a typical plan view of a chip showing an integrated circuit having the surge protective device shown in FIG. 1.

FIG. 6 indicates surge-absorbing circuits 300 and 400 formed by respectively disposing a plurality of the above-described surge protective devices 200 in series.

On a chip 201 are provided a signal-processing circuit 202 made up of an integrated circuit, a ground contact electrode (ground pad) 203 connected to a low-level power-supply line (not illustrated), a signal contact electrode (pad for signal line) 204 connected to an input- or output-signal line (not illustrated) of the signal-processing circuit 202, and a power-supply contact electrode (power-supply pad) 205 connected to a high-level power-supply line (not illustrated). These contact electrodes 203 to 205 are wired to an external portion via respective bonding wires (not -illustrated). The ground contact electrode 203 is disposed between the surge-absorbing circuits 300 and 400 in such a manner that anodes of the respective surge protective devices 200 positioned at the lowest potential sides in the surge-absorbing circuits 300 and 400 are disposed adjacently to the ground contact electrode 203. Accordingly, distance of wiring (not illustrated) from the ground contact electrode 203 to each of the respective surge protective devices 200 can be shortened, a decline in surge-current absorbing characteristic due to a voltage drop of this wiring can be suppressed, and moreover blowing of wiring due to increase in resistance loss of this wiring can be suppressed.

Figure 7:
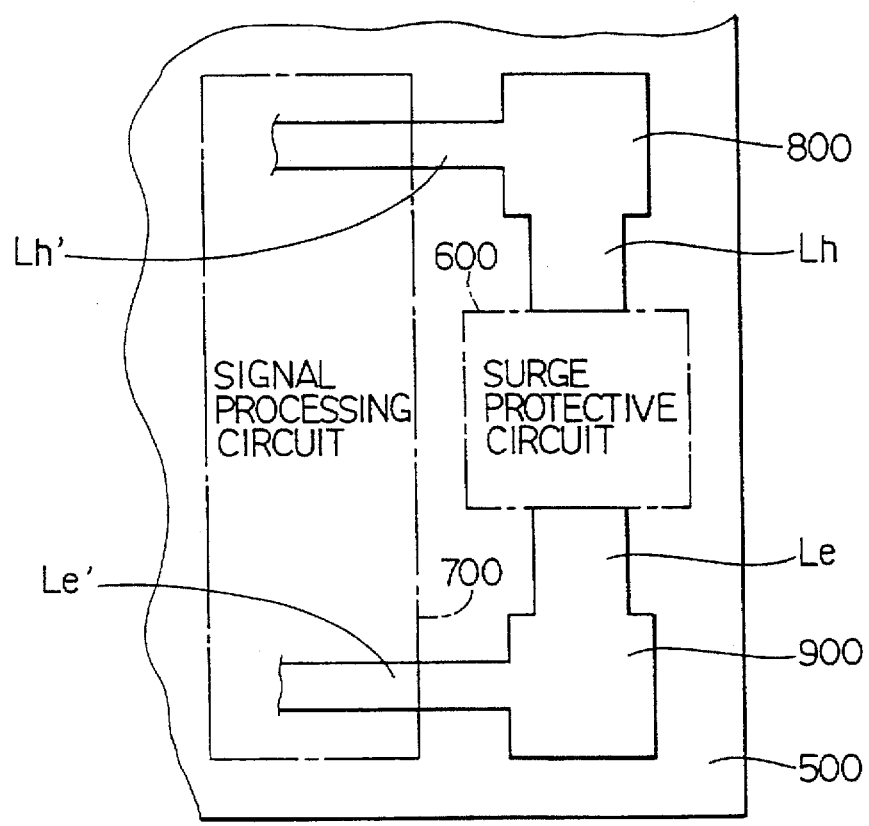
FIG. 7 is a plan view showing an integrated circuit according to a second embodiment.

A second embodiment of a surge protective device according to this invention will be described hereinafter with reference to FIG. 7.

A surge-absorbing circuit 600 made up of a plurality of the above-described surge protective device connected in series and a signal-processing circuit 700 made up of an integrated circuit to perform predetermined signal processing are formed on a chip 500. The surge-absorbing circuit 600 is connected to a power-supply contact electrode (power-supply pad) 800 via a high-level power-supply line Lh, and along with this, is connected to a ground contact electrode (ground pad) 900 via a low-level power-supply line Le. On the other hand, the signal-processing circuit 700 is supplied with power-supply voltage Vcc from the power-supply contact electrode 800 via a high-level power-supply line Lh', and along with this, is -connected to the ground contact electrode 900 via a low-level power-supply line Le'. The power-supply contact electrode 800 is applied with power-supply voltage Vcc from an external power supply via a bonding wire (not illustrated), and the ground contact electrode 900 is connected to an external ground via a bonding wire (not illustrated).

According to this embodiment, the high-level power-supply line Lh and the low-level power-supply line Le connecting the surge-absorbing circuit 600 and the contact electrodes 800 and 900 are caused to be wider than the high-level power-supply line Lh' and the low-level power-supply line Le' connecting the signal-processing circuit 700 and the contact electrodes 800 and 900. Therefore, blowing of the high-level power-supply line Lh and the low-level power-supply line Le due to surge current can be suppressed.

Furthermore, it is also possible to cause the high-level power-supply line Lh' and the low-level power-supply line Le' for the signal-processing circuit 700 to be extended from within the surge-absorbing circuit 600 or to branch midway from the high-level power-supply line Lh and the low-level power-supply line Le instead of being extended from the contact electrodes 800 and 900; the same mode of operation and effects can be obtained.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A surge protective device, comprising:
   a collector region of a first conductivity type provided on a semiconductor substrate;
   a base region of a second conductivity type disposed at a surface portion of said collector region;
   an emitter region of a first conductivity type disposed within said base region, said base region and said emitter region collectively forming a voltage-regulation diode in which said emitter region makes up a cathode and said base region makes up an anode; and
   a surface collector region of said first conductivity type disposed at said surface portion of said collector region, said surface collector region being directly shorted to said base region by a wire.

2. A surge protective device according to claim 1, wherein said emitter region is disposed in said base region so as to be arranged between a base contact hole through which said base region is connected to an electrode and said surface collector region.

3. A surge protective device according to claim 2, wherein said emitter region has a plane pattern sandwiching said base contact hole, said surface collector region having such a plane pattern that said surface collector region and said base contact hole together interpose said emitter region therebetween.

4. A surge protective device according to claim 2, wherein an impurity concentration of said surface collector region is higher than that of said collector region, and said base region and said surface collector region are continguous.

5. A surge protective device according to claim 3, wherein an impurity concentration of said surface collector region is higher than that of said collector region, and said base region and said surface collector region are contiguous.

6. A surge protective circuit comprising a plurality of said surge protective devices according to any one of claims 1 through 5, said surge protective devices being connected in series and formed integratedly on a semiconductor.

7. An integrated circuit comprising:
   a first surge protective circuit comprising a plurality of said surge protective devices according to any one of claims 1 through 5, said surge protective devices of said first surge protective circuit being connected in series and formed integratedly on a semiconductor;
   a second surge protective circuit comprising a plurality of said surge protective devices according to any one of claims 1 through 5, said surge protective devices of said second surge protective circuit being connected in series and formed integratedly on said semiconductor;
   a signal processing circuit formed on said semiconductor substrate and isolated from said first and said second surge protective circuits; and a high-level power-supply line, a low-level power-supply line, and a signal line for input or output use, all of which are connected to said signal processing circuit, wherein said first surge protective circuit is connected between said high-level power-supply line and said low-level power-supply line and said second surge protective circuit is connected between said signal line and said low-level power-supply line, wherein an anode of said surge protective device connected in said first surge protective circuit at a lowest potential side, together with an anode of said surge protective device connected in said second surge protective circuit at a lowest potential side, is disposed adjacently to a pad portion of said low-level power-supply line.

8. An integrated circuit comprising:

a surge protective circuit comprising said surge protective device according to any one of claims 1 through 5, said surge protective circuit being formed on said semiconductor substrate;

a signal processing circuit formed on said semiconductor substrate and isolated from said surge protective circuit;

a first electric line connecting said signal processing circuit with a pad portion; and a second electric line connecting said surge protective circuit with said pad portion, said second electric line being formed wider in line width than said first electric line.

9. A surge protective circuit comprising said surge protective device according to claim 1, said surge protective device being connected in parallel to a signal processing circuit by said anode of said voltage-regulation diode connected to a low-level power-supply line for said signal processing circuit and said cathode thereof connected to a high-level power-supply line therefor.

10. A surge protective device, comprising:

a collector region of an N conductivity type provided on a semiconductor substrate;

a base region of a P conductivity type disposed at a surface portion of said collector region;

an emitter region of said N conductivity type disposed within said base region, said base region and said emitter region collectively forming a voltage-regulation diode in which said emitter region makes up a cathode and said base region makes up an anode; and a surface collector region of said N conductivity type disposed at said surface portion of said collector region, wherein said surface collector region and said base region are connected to a low-level power-supply line, and said emitter region is connected to a high-level power-supply line.

11. A surge protective device according to claim 10, wherein impurity concentrations of said collector region, base region and emitter region have the following relationship:

$$N_E > N_B > N_C$$

wherein $N_E$ is an impurity concentration of said emitter region, $N_B$ is an impurity concentration of said base region, and $N_C$ is an impurity concentration of said collector region.

* * * * *